(12) United States Patent
Law et al.

(10) Patent No.: US 8,611,127 B1
(45) Date of Patent: *Dec. 17, 2013

(54) STACKED MEMORY DEVICE HAVING A SCALABLE BANDWIDTH INTERFACE

(75) Inventors: Patrick Y. Law, Cupertino, CA (US); James B. Keller, Redwood City, CA (US); R. Stephen Polzin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/495,540

(22) Filed: Jun. 13, 2012

Related U.S. Application Data

(63) Continuation of application No. 12/902,599, filed on Oct. 12, 2010, now Pat. No. 8,218,347.

(51) Int. Cl.
*G11C 5/06* (2006.01)
(52) U.S. Cl.
USPC ................................ 365/63; 365/51; 257/621
(58) Field of Classification Search
USPC .................. 365/63, 51, 158, 185.01, 189.02, 365/230.03, 64; 257/621, 774, 777, 758, 257/686, 690, 737
See application file for complete search history.

(56) References Cited

U.S. PATENT DOCUMENTS

| 6,235,554 | B1 | 5/2001 | Akram |
| 6,400,008 | B1 | 6/2002 | Farnworth |
| 7,592,689 | B2 | 9/2009 | Brunnbauer |
| 7,868,445 | B2 | 1/2011 | Kohl et al. |
| 8,218,347 | B1 * | 7/2012 | Law et al. ........... 365/63 |
| 2010/0174858 | A1 | 7/2010 | Chen |

* cited by examiner

*Primary Examiner* — Douglas King
(74) *Attorney, Agent, or Firm* — Meyertons, Hood, Kivlin, Kowert & Goetzel, P.C.; Stephen J. Curran

(57) ABSTRACT

A memory device having a scalable bandwidth I/O data bus includes a semiconductor die having a substrate with a first and a second surface. The substrate includes contact pads arranged in rows across the first surface and across the second surface. The contact pads on one surface may be physically arranged in vertical alignment with a corresponding contact pad on the other surface and may be electrically coupled to the corresponding contact pad using a via. The substrate also includes a metallization layer formed on the second surface. The metallization layer includes external data contact pads each arranged in vertical alignment with a respective contact pad on the second surface. Each row of contact pads may be grouped, and the external contact pads within a group are electrically coupled to an adjacent contact pad on the second surface by effectively logically shifting them to the right one contact pad.

22 Claims, 6 Drawing Sheets

STACKED MEMORY DEVICE HAVING A SCALABLE BANDWIDTH INTERFACE

PRIORITY INFORMATION

This application is a continuation of U.S. patent application Ser. No. 12/902,599 entitled "Stacked Memory Device Having A Scalable Bandwidth Interface" filed Oct. 12, 2010, now U.S. Pat. No. 8,218,347 to which priority is claimed.

BACKGROUND

1. Technical Field

This disclosure relates to memory devices and more particularly to stacked memory device bus structures.

2. Description of the Related Art

Recent advances in manufacturing capability has allowed memory device manufacturers to begin creating devices in which individual memory device die are stacked one on top of the other. More particularly, to allow the signals from a top die to be routed to a bus or other interface at the bottom of the stack, a technique referred to as through silicon vias (TSV) is used. There are various ways of implementing TSV, but the basic concept is that holes are created through each die from one side to the other, and the holes are metallized. When the dice are aligned and mechanically bonded, a die-to-die electrical pathway (or bus) is created from each signal on the top die all the way through all of the dice to a contact pad on the bottom surface of the bottom die. The die-to-die connections may be made using a bump process, for example. Some advantages of using stacked devices are the lead lengths are more uniform and shorter than typical circuit board traces. Accordingly, memory bus speed may be increased with less signal distortion. However, a disadvantage of using a TSV flow during manufacturing is added cost. Thus, it would desirable for memory architectures that use the TSV flow to have a higher return on investment. However, in some cases, such as in systems that use a wide memory bus, for example, if the bandwidth of such a bus structure does not scale as memory chips are added to the memory system, the cost of manufacturing may outweigh the benefit of using the stacked devices.

SUMMARY

Various embodiments of a memory device having a scalable bandwidth input/output data bus. In one embodiment, the memory device includes a semiconductor die having a substrate. The substrate includes a first surface and a second surface. The substrate also includes contact pads arranged in rows across the first surface, contact pads arranged in rows across the second surface. Each of the contact pads of the second surface may be physically arranged in a vertical alignment with a corresponding contact pad of the contact pads of the first surface and may be electrically coupled to the corresponding contact pad using a via, such as a through silicon via, for example. The substrate also includes a metallization layer formed on the second surface. The metallization layer may include external data contact pads arranged in rows. Each of the external data contact pads may be arranged in vertical alignment with a respective contact pad on the second surface. Each row the external data contact pads may be grouped into groups of 'n' contact pads, numbered consecutively from A0 to An−1, and each row of the contact pads of the second surface is also grouped into groups of 'n' contact pads, numbered consecutively from B0 zero to Bn−1, where n is a positive integer. Lastly, for each group, a given external data contact pad Ak is electrically coupled to the contact pad Bk+1 on the second surface, where k is from zero to n−1, and the An−1 external contact pad is electrically coupled to the B0 contact pad on the second surface. Thus, the external contact pads within a group are electrically coupled to the contact pads on the second surface in a way that effectively logically shifts them to the right one contact pad. Then the last external contact pad in a group is electrically coupled to the first contact pad in the group on the second surface.

In one implementation, the memory device also includes an internal data bus having a number of internal data signals, which may be electrically coupled to at least some of the external data contact pads.

In another implementation, the memory device also includes an input/output driver unit that may selectively output data from the internal data signals to at least some of the external data contact pads based upon one or more control signals.

Figure 1:
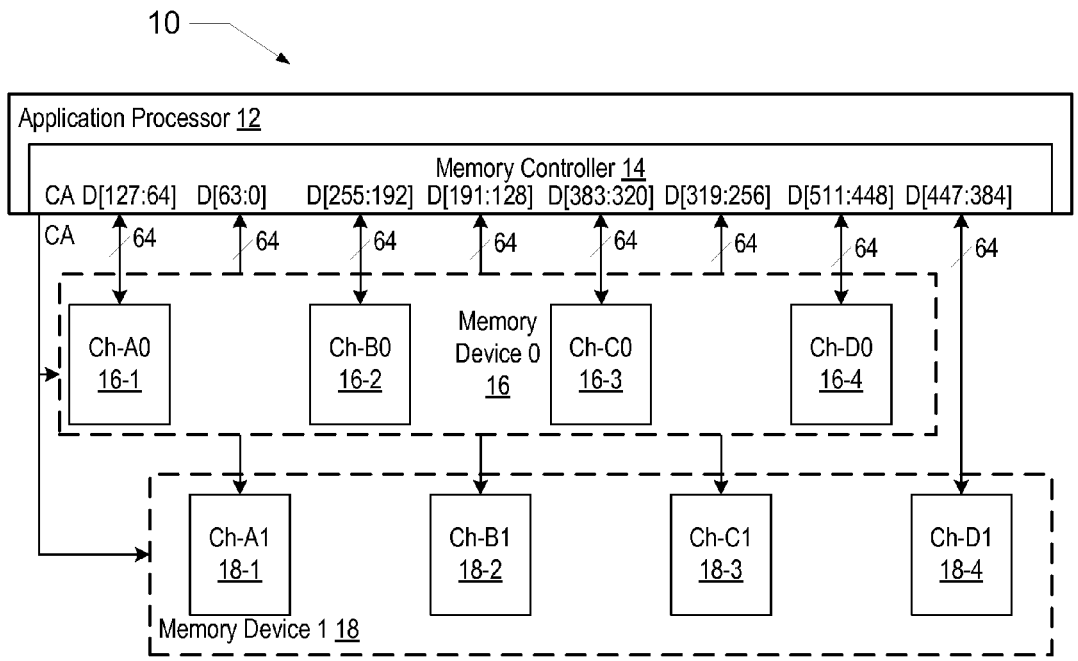
FIG. 1 is a block diagram of one embodiment of a system including an application processor and a system memory including a number of memory devices.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a system including an application processor and a system memory is shown. The system 10 includes an application processor 12 coupled to memory devices 0 and 1, which are designated 16 and 18 respectively.

In one embodiment, the application processor 12 may be representative of any of a variety of processors used to execute instructions. As shown, the application processor 12 includes a memory controller 14 that may be configured to control the memory transactions between the application processor 12 and the memory devices 16 and 18.

In one embodiment, each memory device 16 and 18 may be a device in the dynamic random access memory (DRAM) family of devices. Accordingly, each memory device may include one or more memory arrays, buffers, drivers, and control logic (all not shown). In addition, as shown each memory device 16 and 18 includes a data bus that includes up to 512 data bus bits. Further, in one embodiment, each DRAM may include four memory segments each corresponding to a separate memory channel. Accordingly, in the illustrated embodiment, each of the memory devices 16 and 18 is partitioned into four memory segments (channels). Within memory device 16, the segments are designated as 16-1, 16-2, 16-3, and 16-4, and in memory device 18 the segments are designated as 18-1, 18-2, 18-3, and 18-4. Each of the segments corresponds to one of four memory channels. For example, within memory device 16, memory segment 16-1 corresponds to memory channel A0, memory segment 16-2 corresponds to memory channel B0, and so on. Likewise for memory device 18, in which memory segment 18-1 corresponds to memory channel A1, memory segment 18-2 corresponds to memory channel B1, and so on.

As shown, the memory controller 14 includes a memory interface that includes data bus connections and control and address (e.g., CA) connections that are coupled to each of the memory devices 0 and 1. It is noted that the CA signals are shown coupled to the memory device itself for simplicity. However, a separate set of CA signals may be coupled to each of the channels independently. In the illustrated embodiment, the memory interface includes 512 such data bus connections and they are designated as D[511:0]. However, as shown the data bus is partitioned into eight 64-bit groups. Each of the memory devices corresponds to what is referred to as a memory slice. Thus, in FIG. 1 two slices are shown. Each slice has four channels, and in the illustrated embodiment, each channel uses 64 data bits. In the illustrated embodiment, each memory device 16 and 18 may operate in a double data rate (DDR) mode, as described further below. In this configuration (i.e., a two-slice configuration) the memory bus bandwidth may be 8×64 b at 200 MHz DDR.

Figure 2:
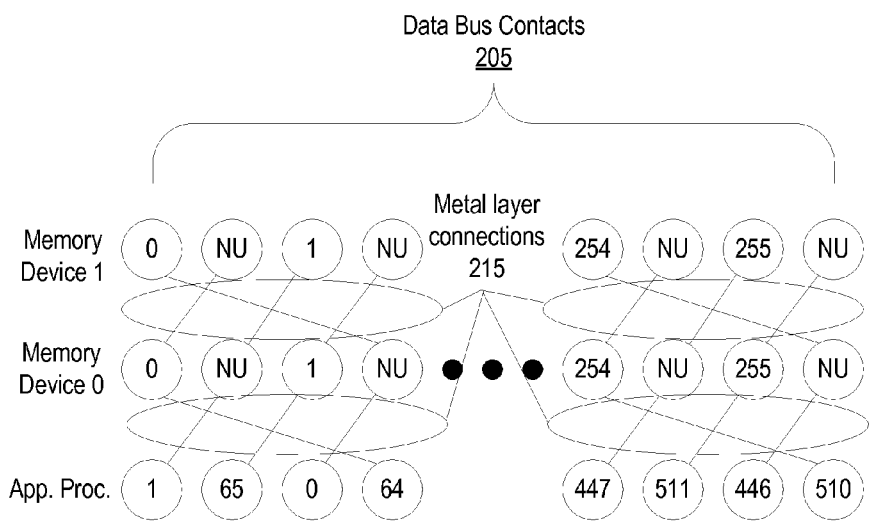
FIG. 2 is a diagram illustrating the chip-to-chip bus connections of an embodiment of the memory devices shown in FIG. 1.
Figure 5:
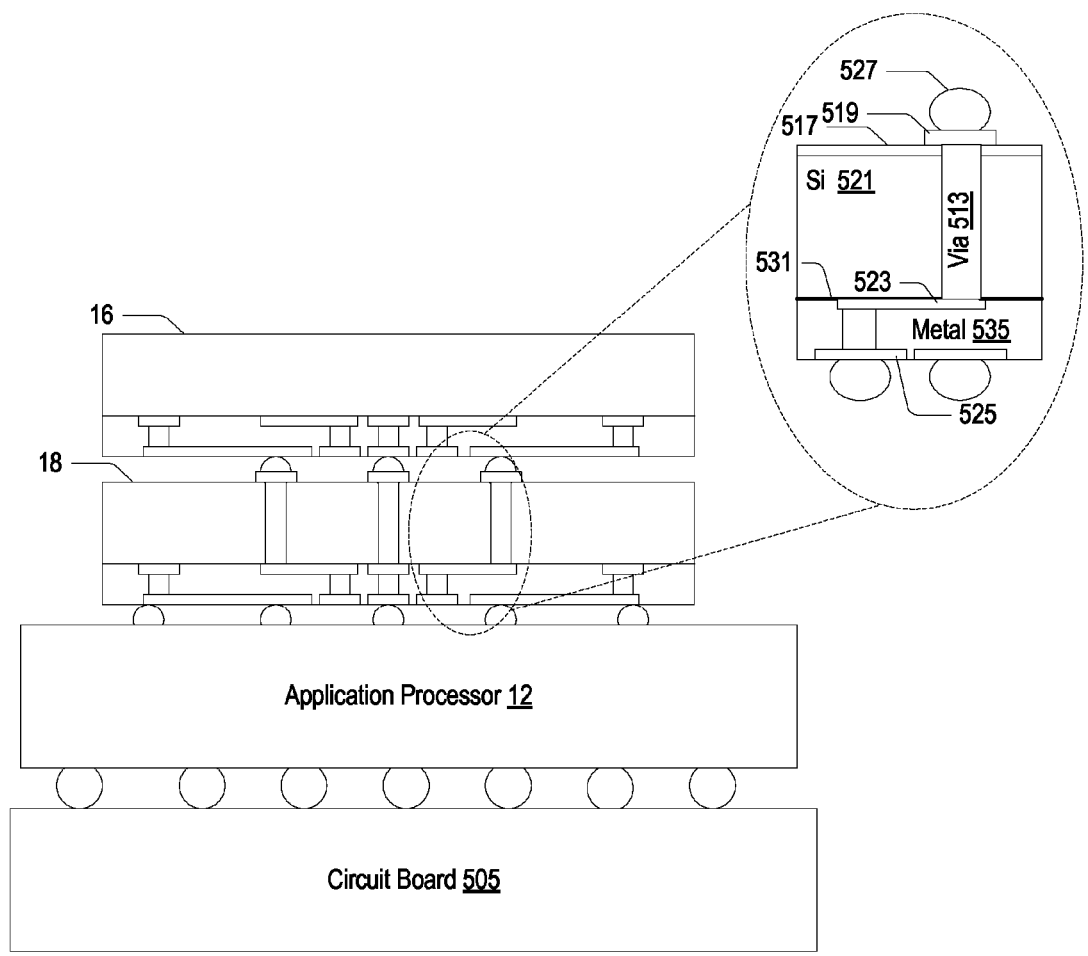
FIG. 5 is a diagram illustrating a cut away view of one embodiment of the system shown in FIG. 1.

As shown in FIG. 5, the system 10 may be implemented as a stacked structure such that the memory devices may be stacked on top of each other and the two memory devices 16 and 18 are then stacked onto the application processor 12 using TSV, for example. Accordingly, to operate the system 10 as shown in FIG. 1 and described above, the data bus connections between each memory device and the application processor 12 may be different than what is used in a conventional TSV stacked device. In a conventional TSV implementation the memory bus data contacts would be connected vertically so that each contact on a device would be connected to the contact above it in vertical alignment, and that contact would be connected to the contact above it in vertical alignment on the next device through the TSV. In such a conventional configuration, the data bus connections are shared among each of the memory devices, and chip selects may be used to allow only one memory device to drive data onto a given data bus connection at a time, thereby providing a contention-free data bus. However, the bandwidth of this conventional type of configuration does not scale as more memory devices are added by simply increasing the clock speed. More particularly, the bandwidth corresponds to bus width×data rate. As an example of the conventional configuration, if there is one memory device with a fetch size of 128 b and operating at a given single data rate (e.g., 5 ns=200 MHz) and another memory device is added and operated as DDR to scale the clock, the fetch size would need to be increased to 256 b since the CAS cycle is still 5 ns. This increase in fetch size would be cost prohibitive in many systems, since the data bus width would need to be increased to transfer the data being fetched. However, in contrast to increasing the data bus size, as shown in FIG. 2, the data bus connections are grouped into 4-bit nibbles and the connections are rotated within each group. This bus configuration effectively allows each memory device to have its own exclusive data bus, which allows the system to scale up the data rate as devices are added to the stack, without increasing the fetch size.

Referring to FIG. 2, a wiring diagram illustrating the chip-to-chip bus connections of an embodiment of the memory devices shown in FIG. 1 is shown. In FIG. 2, the data bus contacts 205 are shown in rows and columns. These rows and columns represent a two dimensional view of the data bus connections as they would be in a stacked memory bus architecture. The data bus contacts of the application processor 12 are shown on the bottom row, the data bus contacts for the memory device 0 are on top of the application processor 12 represented by row two, and the data bus contacts for the memory device 1 are on top of the contacts for memory device 0, as represented by row three. As mentioned above this diagram represents a two-slice memory configuration.

As shown, the data bus is grouped into four-bit nibbles, and within each group the connections between devices are rotated right one bit. Starting with the first bit on the left, it is connected to the bit to its right of the device above. The same is true for the second and third bits, as shown. However, the last bit on the right is rotated to connect to the first bit on the left of the device above. This rotation is used on each memory device. Thus, each memory device is connected to a dedicated data bus. To implement this connection scheme, while keeping the same number of contacts, some contacts are not used. As shown in FIG. 2, two contacts out of every four are not used. As described in greater detail below in conjunction with the description of FIG. 5, in various embodiments the rotated connections may be implemented in the metal layers of each memory device. This is represented in FIG. 2 as metal layer connections 215 shown on memory device 1.

In the illustrated embodiment, the memory device data bus contacts for memory devices 0 and 1 are numbered from left to right as zero, NU, one, NU . . . 254, NU, 255, NU, thereby representing a 512-bit wide bus in which only half of the data bus contacts are used. However, between the two memory devices there are 512 data bus contacts coupled to the application processor 12. The application processor 12 has a 512-bit data bus and is numbered in such a way as to mate with the stacked memory devices to have the correct data bit aligned with the correct contact on the memory device stack. In other words, if viewed from the top, each of the semiconductor dies of the memory devices and the application processor would include contact pads that are arranged to have the same footprint so that when stacked the contact pads are aligned. In the illustrated embodiment, the application processor data bus numbering matches the numbering scheme used in FIG. 1.

Accordingly, memory device 0 is connected to data bus contacts 127:64, 255:192, 383:320, and 511:448, while memory device 1 is connected to data bus contacts 63:0, 191:128, 319:256, and 447:384. Thus, in FIG. 2 data bit zero of the application processor 12 (third contact from the left of the group on the left) is coupled to the data bit zero contact of the memory device 1 (contact first from left) through the TSV and metal layer connections of memory device 0, which is coupled to last contact on the right of memory device 0. However, since memory device 0 does not use that contact (designated NU), memory device 1 has exclusive use of that data bus contact. Similarly for data bit 1 of the application processor 12 (first contact on left). Data bit 1 is connected to data bit one of memory device 1 through the TSV and metal layer connections of memory device 0 (contact second from the left). However, as shown, that contact is unused by memory device 0. The connections to memory device 0 are implemented in a similar way. For example, data bit 64 of the application processor 12 is connected to data bit zero of memory device 0. However, due to the TSV and metal layer connections 215, that data bus contact is also connected to memory device 1 (contact second from left), which as above, is not used by memory device 1.

Figure 3:
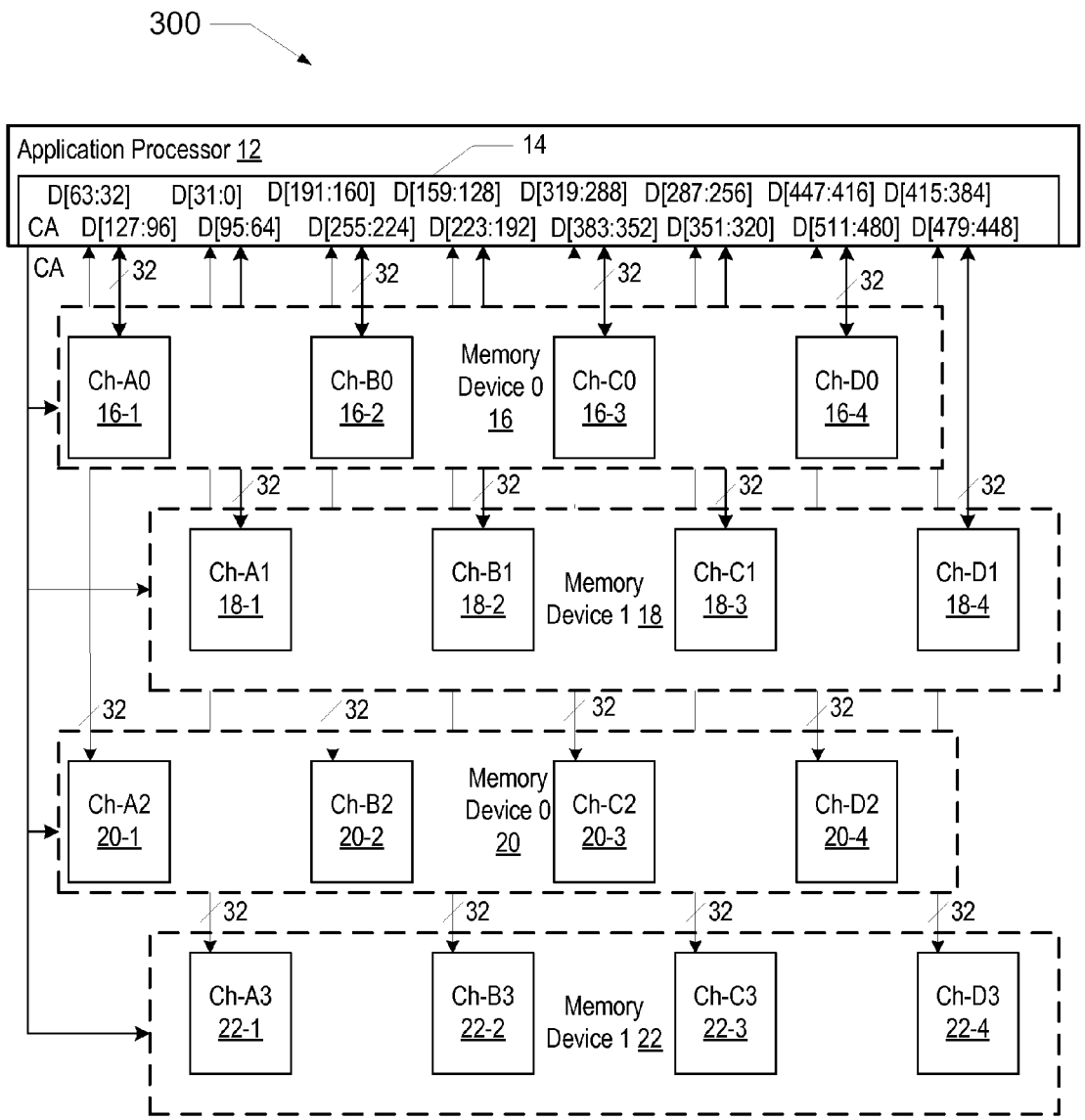
FIG. 3 is a block diagram of another embodiment of a system including an application processor coupled to a number of memory devices.

Turning to FIG. 3, a block diagram of one embodiment of a system including an application processor and a system memory in a four-slice configuration is shown. Components that correspond to those shown in FIG. 1 and FIG. 2 are numbered identically for clarity and simplicity. Similar to the system 10 shown in FIG. 1, the system 300 includes also an application processor 12 coupled to a system memory. However, in FIG. 3, the system memory includes memory devices 0, 1, 2, and 3, which are designated 16, 18, 20, and 22, respectively. In addition, in FIG. 3, each channel includes only 32 bits, instead of 64. However, even though there are only 32 bits per channel, in one embodiment each memory device may operate at 400 MHz DDR so that the bandwidth may be 16×32 b at 400 MHz DDR.

Figure 4:
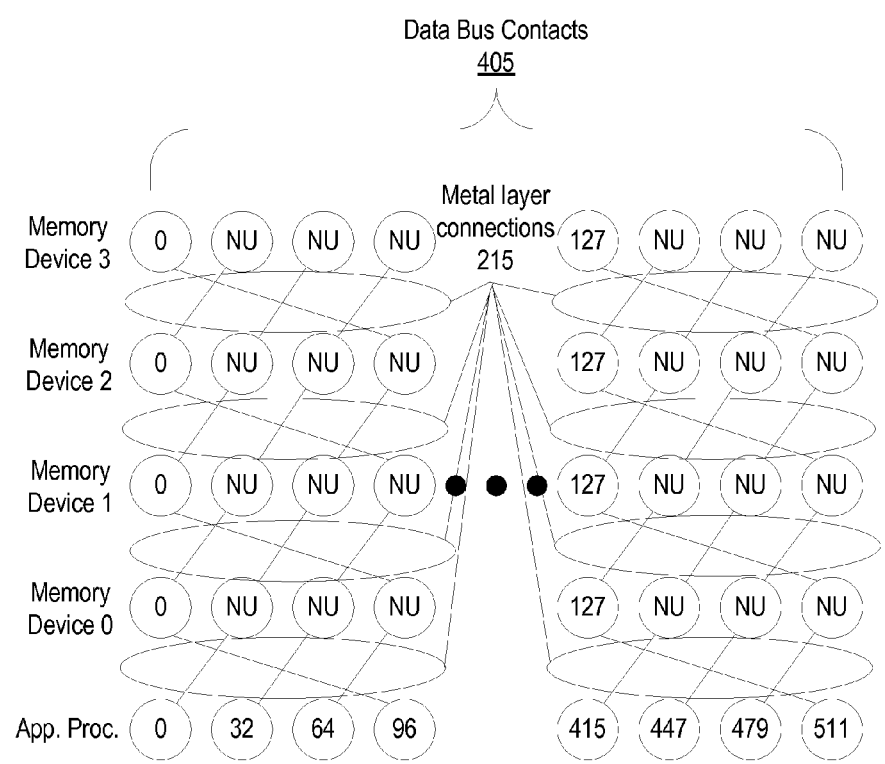
FIG. 4 is a diagram illustrating the chip-to-chip bus connections of an embodiment of the memory devices shown in FIG. 3.

Referring to FIG. 4, a wiring diagram illustrating the chip-to-chip bus connections of an embodiment of the memory devices shown in FIG. 3 is shown. Similar to FIG. 2, the data bus contacts 405 of FIG. 4 are shown in rows and columns. These rows and columns represent a two dimensional view of the bus connections as they would be in a stacked memory bus architecture. The data bus contacts of the application processor 12 are shown on the bottom row. The contacts for the memory device 0 are on top of the application processor 12 represented by row two, the contacts for the memory device 1 are on top of the contacts for memory device 0, as represented by row three, the contacts for the memory device 2 are on top of the contacts for memory device 1, as represented by row four, and the contacts for the memory device 3 are on top of the contacts for memory device 2, as represented by row five. As mentioned above this diagram represents a four-slice memory configuration. It is noted that the data bus numbering corresponds to the numbering used in FIG. 3.

Similar to the diagram of FIG. 2, the metal layer connections 215 of the memory devices of FIG. 4 are configured to rotate the connections to the right such that the data bus is grouped into four-bit nibbles, and within each group the connections between devices are rotated right one bit. Starting with the first bit on the left, it is connected to the bit to its right of the device above. The same is true for the second and third bits, as shown. However, the last bit on the right is rotated to connect to the first bit on the left of the device above. This rotation is used on each memory device. Thus, each memory device is connected to a dedicated data bus. To implement this connection scheme, while keeping the same number of contacts, some contacts are not used. As shown in FIG. 4, three contacts out of every four are not used (e.g., NU).

Turning to FIG. 5, a diagram illustrating a cut away view of one embodiment of the system shown in FIG. 1 is shown. Components that correspond to those shown in FIG. 1 are numbered identically for clarity and simplicity. The system shown in FIG. 5 includes a memory device 16 stacked on a memory device 18, which is stacked on application processor 12. The application processor is mounted to the circuit board 505.

The exploded view includes additional details of the memory device 18. More particularly, the memory device 18 includes a silicon substrate 521. A TSV (via 513) is shown extending from a top surface to a bottom surface, and making contact with a micropad 519 on the top surface and to a micropad 523 on the bottom surface of the silicon substrate. On the top surface of the silicon substrate 512 is a layer of silicon dioxide 517. Sitting on the micropad 519 is a solder joint 527, which may also referred to as a bump. The metal 535 is representative of one or more metal layers that may be formed on the bottom surface of the silicon substrate 521. This metal 535 may include a number of metal traces (wires) and contact pads and micropads such as micropad 525.

As shown, the micropad 525 is connected to the via 513 which is not aligned vertically with the micropad 525, but which instead to the right of micropad 525. Accordingly, in a manner similar to this, the metal layers may implement the rotated data bus connections shown I FIG. 2 and FIG. 4.

As described above in the two-slice embodiment of FIGS. 1 and 2, and the four-slice embodiment of FIGS. 3 and 4, each memory device has exclusive use of the same particular data bus I/O contacts. To facilitate manufacturing the memory devices in a way that allows one memory device to be used in a one, two or four-slice configuration, in one embodiment the memory devices (e.g., 16, 18, 20, and 22) may include a programmable I/O driver that may select which data bus I/O contacts are used. Accordingly, in FIG. 6, a block diagram of one embodiment of a configurable input/output (I/O) driver of the memory devices of FIG. 1 through FIG. 4 is shown.

Referring collectively to FIG. 2, FIG. 4 and FIG. 5, one way to view the contact pad arrangement is that each memory device (e.g., 16 and 18) includes several rows of contact pads (e.g., 519) on one surface of the die (e.g. 517 in FIG. 5), and several rows of contact pads (e.g., 523) on a second surface of the die (e.g., 531 in FIG. 5). The contact pads in the rows on one surface are arranged so that they are vertically aligned with the contact pads on the other surface. The each vertically aligned contact pad is electrically coupled to a corresponding contact pad with the TSVs (e.g., 513). In addition, each memory device includes several rows of external data contact pads (e.g., 525). These external contact pads are the pads that are used to connect to the next device using a solder joint. The external data contact pads are grouped logically into some number of contact pads. As described above, in various embodiments that number is four. However, in other embodiments that number may be different. So in the general case, the number of contact pads in a group may be represented by n, where n may be any positive integer. If the contact pads are numbered consecutively zero to n−1 within a group, then each external data contact pad in a group is electrically coupled to a contact pad on the second surface numbered n+1, with the exception of the last (i.e., n−1) contact pad in a group. The n−1 contact pad in a group is coupled to the zeroeth contact pad on the second surface. Thus, in each group it appears that the connections are logically rotated to the right, and the last connection wraps around to the first position.

It is noted that as described above the terms one surface and second surface are used for discussion since the memory devices shown in FIG. 5 are arranged in a flip-chip configuration such the die is shown upside down. That is, each die is positioned with the active (i.e., circuit) side down.

Figure 6:
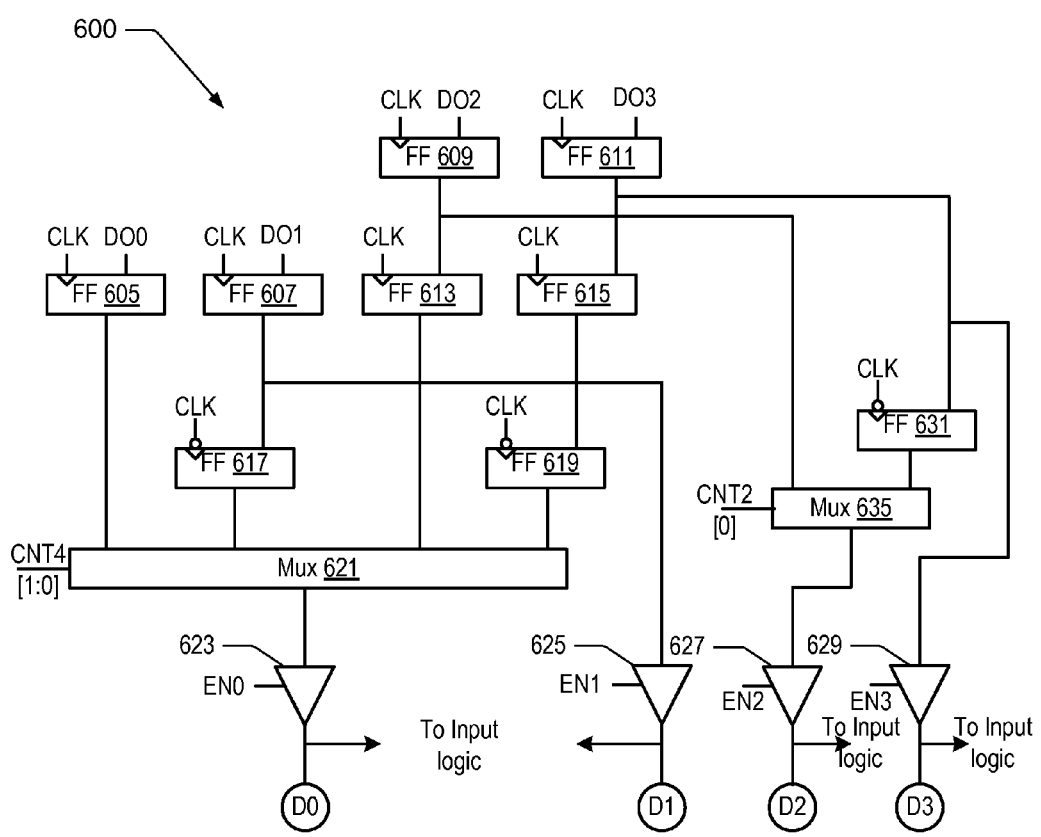
FIG. 6 is a block diagram of one embodiment of a configurable input/output (I/O) driver of the memory devices shown in FIG. 1 and FIG. 3.

Referring to FIG. 6, the I/O unit 600 includes a flip-flop FF605 which is coupled to receive the data out signal DO0 and is clocked by a CLK signal. The output of FF605 is coupled to one input of the four-to-one multiplexer (mux) 621. The output of the mux 621 is coupled to a high impedance or (tri-state) buffer 623. The output of the buffer 623 is coupled to I/O contact D0. The I/O unit 600 also includes a FF607 which is coupled to receive the data out signal DO1 and is clocked by the CLK signal. The output of FF607 is coupled to a second input of the mux 621. The I/O unit 600 also includes a FF609 which is coupled to receive the data out signal DO2 and is clocked by the CLK signal. The output of FF609 is coupled to the data input of a FF613 which is clocked by a CLK! signal. The output of the FF613 is coupled to a third input of mux 621. Similarly, the I/O unit 600 also includes a FF611 which is coupled to receive the data out signal DO3 and is clocked by the CLK signal. The output of FF611 is coupled to the data input of a FF615. The output of the FF615 is coupled to the data input of FF619 which is clocked by the CLK! signal. The output of FF619 is coupled to a fourth input of the mux 621. In addition, the output of FF607 is also coupled to a high impedance or (tri-state) buffer 625. The output of the buffer 625 is coupled to I/O contact D1. The output of FF609 is also coupled to one input of the two-input mux 635. The output of mux 635 is coupled to a high impedance or (tri-state) buffer 627, which is coupled to I/O contact D2. The output of FF611 is also coupled to the data input of FF631, which is clocked by the CLK! signal, and to a high impedance or (tri-state) buffer 629. The output of the buffer 629 is coupled to I/O contact D3. The output of FF631 is coupled to the other input of mux 635.

It is noted that I/O driver unit 600 also includes the remaining logic for the I/O contacts D4-D511. However, that logic is not shown for brevity and simplicity. In the illustrated embodiment, the contacts are bidirectional. As such, the contacts are also connected to input logic which is also not shown for simplicity. Although the input logic is similar to the output logic in that there is also a four-to-one mux and a number of flip-flops.

As mentioned above, the I/O driver unit 600 may be used in various memory configurations. For example, in a one-slice configuration in which there is only one memory device (e.g., 16), the memory device may use all 512 data bus contacts and may operate as an SDR DRAM. In such a configuration, the multiplexer 621 may be controlled to always select the output of FF605, and multiplexer 635 may be controlled to select the output of FF609. Each of the buffers 623-629 may be enabled, and as data is clocked out of FF605, FF607, FF 609, and FF611, that data is presented to the data bus contacts D0-D3.

However, if the memory device is used in a two-slice configuration as shown in FIG. 1 and FIG. 2, the memory device may be used as a DDR DRAM in which data bus contacts D1 and D3 are not used. As such, the mux 621 may be controlled to alternately select the output of FF605 and FF617. Thus, the DO0 data from FF605 may be presented to data bus contact D0 on a rising edge of CLK, and the DO1 data from FF617 may be presented to data bus contact D0 on the next falling edge of CLK (e.g., CLK!). In addition, the enable signals EN1 and EN3 may disable the buffers 625 and 629. Similarly, the mux 635 may be controlled to alternately select the output of FF609 and FF631. Thus, the DO2 data from FF609 may be presented to data bus contact D2 on a rising edge of CLK, and the DO3 data from FF631 may be presented to data bus contact D2 on the next falling edge of CLK (e.g., CLK!).

If the memory device is used in a four-slice configuration as shown in FIG. 3 and FIG. 4, the memory device may be used as a DDR DRAM in which data bus contacts D1 though D3 are not used. As such, the mux 621 may be controlled to alternately select the outputs of FF605, FF617, FF613, and FF619. Thus, the DO0 data from FF605 may be presented to data bus contact D0 on a first rising edge of CLK, and the DO1 data from FF617 may be presented to data bus contact D0 on the next falling edge of CLK (e.g., CLK!). On the next rising edge of CLK, the DO2 data from FF613 may be presented to data bus contact D0, and the DO3 data from FF619 may be presented to data bus contact D0 on the next falling edge of CLK. In addition, the enable signals EN1, EN2, and EN3 may disable the buffers 625, 627, and 629, respectively.

In other embodiments, since the one-slice and two-slice configurations are simply degenerate configurations of the four-slice configuration, the I/O driver unit 600 may be configured to multiplex the four data bits through a single data contact. When a one-slice configuration is used, only 32 bits are used, as in the four-slice configuration. However, the memory device may be operated at 400 MHz. Alternatively, the two-slice configuration may be chosen and used for all configurations as a balance (i.e., 64 bits at 200 MHz DDR), and when there is only one slice, 64 bits are not used. When there are four slices, the slice pairs will share the data bus contacts.

In yet other embodiments, instead of a programmable I/O driver unit the memory devices may be manufactured to have a dedicated wiring in the metal layers such that a given memory device may be used only for a specific memory slice configuration. Thus, a memory device manufacturer may produce one, two, and four-slice memory devices.

It is noted that although the above embodiments include specific data bus contact numbers and number of data bits, it is contemplated that in other embodiments other numberings and other numbers of bits may be used as desired.

It is also noted that although the above memory configurations are shown being used as a system memory used with an application processor, it is contemplated that memory devices (e.g., 16-20) may also be used in a graphics subsystem in which they are coupled with a graphics processor.

Figure 7:
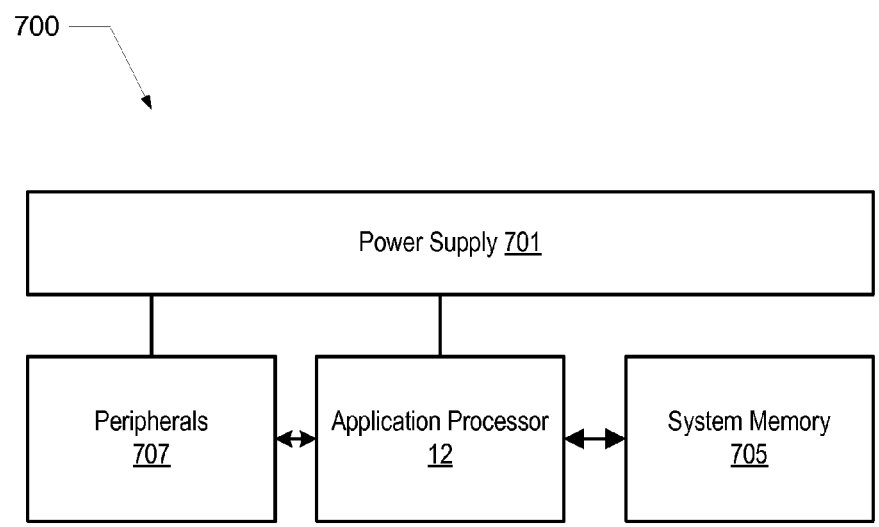
FIG. 7 is a block diagram of one embodiment of a system that includes the system memory devices of FIG. 1 through FIG. 6.

Turning to FIG. 7, a block diagram of one embodiment of a system that includes an application processor coupled to a system memory is shown. The system 700 includes at least one instance of an application processor 12 coupled to one or more peripherals 707 and a system memory 705. A power supply 701 is also provided which supplies the supply voltages to the application processor 12 as well as one or more supply voltages to the system memory 705 (through the application processor 12) and/or the peripherals 707. In one embodiment, application processor 12 may include a memory controller as shown in FIG. 1 and FIG. 3, such that application processor 12 may be considered as a system on a chip (SOC).

The peripherals 707 may include any desired circuitry, depending on the type of system 700. For example, in one embodiment, the system 700 may be included in a mobile device (e.g. personal digital assistant (PDA), smart phone, etc.) and the peripherals 707 may include devices for various types of wireless communication, such as WiFi, Bluetooth, cellular, global positioning system, etc. The peripherals 707 may also include additional storage, including RAM storage, solid-state storage, or disk storage. The peripherals 707 may include user interface devices such as a display screen, including touch display screens or multitouch display screens, keyboard or other input devices, microphones, speakers, etc. In other embodiments, the system 700 may be included in any type of computing system (e.g. desktop personal computer, laptop, workstation, net top etc.).

The system memory 705 may include any type of memory. For example, as described above in conjunction with FIG. 1, the system memory 705 may be dynamic RAM (DRAM) such as synchronous DRAM (SDRAM), double data rate (DDR, DDR2, DDR3, etc.). However, system memory 705 may also be implemented in SDRAM, static RAM (SRAM), or other types of RAM, etc. As described above, in one embodiment, the system memory 705 may include one or more memory device die stacked together and stacked onto the application processor 12 as shown in FIG. 5.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory device comprising:
a semiconductor die having a substrate including:
a first surface and a second surface;
a first plurality of contact pads arranged in rows across the first surface;
a second plurality of contact pads arranged in rows across the second surface, wherein each contact pad of the second plurality of contact pads is in a vertical alignment with a corresponding contact pad of the first plurality of contact pads and is electrically coupled to the corresponding contact pad by a via;
a metallization layer formed on the second surface and including a plurality of external data contact pads arranged in rows, wherein each of the external data contact pads is arranged in vertical alignment with a respective contact pad on the second surface;
wherein each row of the plurality of external contact pads is grouped into a number of groups each including n contact pads, numbered consecutively from A0 to An−1, and each row of the plurality of second contact pads is grouped into a number of groups each including n contact pads, numbered consecutively from B0 zero to Bn−1, where n is a positive integer;
wherein for each group, a given external contact pad Bk is electrically coupled to the contact pad Ak+1 on the second surface, where k is from zero to n−1, and wherein the Bn−1 external contact pad is electrically coupled to the A0 contact pad on the second surface.

2. The memory device as recited in claim 1, wherein the semiconductor substrate includes an active circuit area including a memory array and an internal data bus having a plurality of internal data signals.

3. The memory device as recited in claim 2, wherein at the internal data signals are electrically coupled to at least some of the external contact pads.

4. The memory device as recited in claim 1, further comprising an input/output driver unit configured to selectively output data from a plurality of internal data signals to at least some of the external contact pads based upon one or more control signals.

5. The memory device as recited in claim 4, wherein the plurality of internal data signals comprises 512 internal data signals.

6. The memory device as recited in claim 5, wherein within each group of external contact pads, the input/output driver unit is configured to send and receive data on only a portion of the external data contact pads.

7. The memory device as recited in claim 1, wherein each group of external contact pads includes four external contact pads.

8. The memory device as recited in claim 1, wherein the plurality of external contact pads correspond to data signals of a memory bus of the memory device, and wherein the plurality of data signals comprises 128 bidirectional data signals.

9. The memory device as recited in claim 1, wherein the plurality of external contact pads correspond to data signals of a memory bus of the memory device, and wherein the plurality of data signals comprises 256 bidirectional data signals.

10. The memory device as recited in claim 1, wherein the memory bus further includes command and address signals.

11. The memory device as recited in claim 10, wherein the control logic is configured to generate accesses to the memory array in response to receiving commands via the command and address signals.

12. A memory device comprising:
a semiconductor die having a substrate including:
a first surface and a second surface;
a first plurality of contact pads arranged in rows across the first surface;
a second plurality of contact pads arranged in rows across the second surface, wherein each contact pad of the second plurality of contact pads is in a vertical alignment with, and is electrically coupled to a corresponding contact pad of the first plurality of contact pads;
a metallization layer formed on the second surface and including a plurality of external contact pads arranged in rows, wherein each of the external contact pads is arranged in vertical alignment with a respective contact pad on the second surface;
wherein each row the plurality of external contact pads is grouped into a number of consecutive adjacent external contact pads;
wherein within each group of external contact pads, a given external contact pad of the group is electrically coupled to a respective contact pad on the second surface that is adjacent to a contact pad on the second surface that is aligned vertically to the given external contact pad and within a same row as the given external contact pad, and wherein a last external data contact pad of the group is electrically coupled to a contact pad on the second surface that is vertically aligned with a first external contact pad of the group.

13. The memory device as recited in claim 12, further comprising an input/output driver unit configured to selectively output data from a plurality of internal data signals to at least some of the external contact pads based upon one or more control signals.

14. The memory device as recited in claim 13, wherein the input/output driver unit is programmable to selectively output data from the plurality of internal data signals to at least some of the external contact pads.

15. The memory device as recited in claim 13, wherein within each group of external contact pads, the input/output driver unit is configured to send and receive data on only a portion of the external contact pads.

16. The memory device as recited in claim 15, wherein the input/output driver unit is configured to multiplex one or more of the internal data signals onto given respective ones of the external contact pads.

17. A memory subsystem comprising:
a plurality of memory devices mounted one on top of the other and electrically coupled to one another through a plurality of vias, wherein each memory device includes:
a memory bus including a plurality of data signals and a plurality of address and control signals; and
a semiconductor die having a substrate including:
a first surface and a second surface;
a first plurality of contact pads arranged in rows across the first surface;
a second plurality of contact pads arranged in rows across the second surface, wherein each contact pad of the second plurality of contact pads is in a vertical alignment with a corresponding contact pad of the first plurality of contact pads and is electrically coupled to the corresponding contact pad using a via;
a metallization layer formed on the second surface and including a plurality of external contact pads arranged in rows, wherein each of the external contact pads is arranged in vertical alignment with a respective contact pad on the second surface;
wherein each row the plurality of external contact pads is grouped to include n contact pads, numbered consecutively from A0 to An−1, and each row of the second plurality of contact pads is grouped to include n contact pads, numbered consecutively from B0 zero to Bn−1, where n is a positive integer;
wherein for each group, a given external contact pad Bk is electrically coupled to the contact pad Ak+1 on the second surface, where k is from zero to n−1, and wherein the Bn−1 external contact pad is electrically coupled to the A0 contact pad on the second surface.

18. The memory device as recited in claim 17, further comprising an input/output driver unit configured to selectively output data from a plurality of internal data signals to at least some of the external contact pads based upon one or more control signals dependent upon a number of memory devices in the memory subsystem.

19. The memory device as recited in claim 18, wherein the input/output driver unit is programmable to selectively output data from the plurality of internal data signals to at least some of the external contact pads.

20. A mobile communications device comprising:
an application processor including a memory interface;
a plurality of memory devices mounted one on top of the other, and electrically coupled to one another and to the application processor through a plurality of vias, wherein one of the memory devices is mounted to the application processor, and electrically coupled to the memory interface;
wherein each of the memory devices includes:
a memory bus including a plurality of data signals and a plurality of address and control signals; and
a semiconductor die having a substrate including:
a first surface and a second surface;
a first plurality of contact pads arranged in rows across the first surface;
a second plurality of contact pads arranged in rows across the second surface, wherein each contact pad of the second plurality of contact pads is in a vertical alignment with a corresponding contact pad of the first plurality of contact pads and is electrically coupled to the corresponding contact pad by a via;
a metallization layer formed on the second surface and including a plurality of external contact pads arranged in rows, wherein each of the external contact pads is arranged in vertical alignment with a respective contact pad on the second surface;
wherein each row the plurality of external contact pads is grouped to include n contact pads, numbered consecutively from A0 to An−1, and each row of the second plurality of contact pads is grouped to include n contact pads, numbered consecutively from B0 zero to Bn−1, where n is a positive integer;
wherein for each group, a given external contact pad Bk is electrically coupled to the contact pad Ak+1 on the second surface, where k is from zero to n−1, and wherein the Bn−1 external contact pad is electrically coupled to the A0 contact pad on the second surface.

21. The mobile device as recited in claim 20, further comprising an input/output driver unit configured to send and receive data on only a portion of the external contact pads dependent upon a number of memory devices electrically coupled to the application processor.

22. A method comprising:
arranging a first plurality of contact pads in a plurality of rows across a first surface of a semiconductor die substrate of a memory device;
arranging a second plurality of contact pads in rows of contact pads across a second surface of the semiconductor die substrate;
arranging each contact pad of the second plurality of contact pads in a vertical alignment with a corresponding contact pad of the first plurality of contact pads;
electrically coupling each contact pad of the second plurality of contact pads to the corresponding contact pad using a via;
arranging a plurality of external contact pads in rows within a metallization layer formed on the second surface;
arranging each of the external contact pads in vertical alignment with a respective contact pad on the second surface;
grouping each row the plurality of external contact pads to include n contact pads, numbered consecutively from A0 to An−1, and grouping each row of the second plurality of contact pads to include n contact pads, numbered consecutively from B0 zero to Bn−1, where n is a positive integer;
wherein for each group, electrically coupling within a metallization layer a given external contact pad Bk, to the contact pad $A_{k+1}$ on the second surface, and electrically coupling within the metallization layer the $B_{n-1}$ external contact pad to the $A_0$ contact pad on the second surface.

* * * * *